United States Patent
Ogihara et al.

(10) Patent No.: US 7,402,621 B2
(45) Date of Patent: Jul. 22, 2008

(54) POROUS-FILM-FORMING COMPOSITION, PREPARATION METHOD OF THE COMPOSITION, POROUS FILM AND SEMICONDUCTOR DEVICE

(75) Inventors: Tsutomu Ogihara, Niigata-ken (JP); Fujio Yagihashi, Niigata-ken (JP); Yoshitaka Hamada, Niigata-ken (JP); Takeshi Anaso, Niigata-ken (JP); Motoaki Iwabuchi, Niigata-ken (JP); Masaru Sasago, Hirakata (JP); Hideo Nakagawa, Oumihachiman (JP)

(73) Assignees: Shin-Etsu Chemical Co., Ltd., Tokyo (JP); Matsushita Electric Co., Ltd., Osaka (JP)

( * ) Notice: Subject to any disclaimer, the term of this patent is extended or adjusted under 35 U.S.C. 154(b) by 119 days.

(21) Appl. No.: 11/041,780

(22) Filed: Jan. 24, 2005

(65) Prior Publication Data
US 2005/0165197 A1    Jul. 28, 2005

(30) Foreign Application Priority Data
Jan. 27, 2004  (JP)  ............................. 2004-017994

(51) Int. Cl.
*C08G 77/06*  (2006.01)
(52) U.S. Cl. ........................ 524/321; 524/284; 528/21; 528/34
(58) Field of Classification Search ........................ None
See application file for complete search history.

(56) References Cited

U.S. PATENT DOCUMENTS

| 4,900,778 | A | 2/1990 | Nagashima |
| 6,261,357 | B1 | 7/2001 | Egami et al. |
| 6,495,264 | B2 | 12/2002 | Hayashi et al. |
| 6,639,015 | B1* | 10/2003 | Nakashima et al. ......... 525/106 |
| 2004/0216641 | A1 | 11/2004 | Hamada et al. |

FOREIGN PATENT DOCUMENTS

| EP | 0616001 | B1 | 9/1994 |
| EP | 0890623 | A1 | 1/1999 |
| EP | 1026213 | A1 | 8/2000 |
| JP | 09-315812 | | 12/1997 |
| JP | 2001-294809 | | 10/2001 |
| JP | 2001-316624 | | 11/2001 |
| JP | 2001-354903 | | 12/2001 |
| JP | 2001-354904 | | 12/2001 |
| JP | 2002-020688 | | 1/2002 |

OTHER PUBLICATIONS

European Search Report corresponding to application No. EP 05250339.8, dated May 23, 2005.
Stober et al. "Controlled Growth of Monodisperse Silica Spheres in the Micron Size Range", *Journal of Colloid and Interface Science* 26:62-69 (1968).
Huang et al. "Fabrication of Ordered Porous Structures by Self-Assembly of Zeolite Nanocrystals", *J. Am. Chem. Soc.* 122:3530-3531 (2000).

* cited by examiner

*Primary Examiner*—Marc S Zimmer
(74) *Attorney, Agent, or Firm*—Myers Bigel Sibley & Sajovec (57) ABSTRACT

The invention provides a coating solution for forming a porous film having excellent mechanical strength and dielectric properties and for easily forming a film with a freely controlled film thickness in an ordinarily employed method in semiconductor process. More specifically, provided are a method for preparing a porous-film-forming composition comprising steps of preparing polysiloxane, silica or zeolite particles (Component A), imparting crosslinkability to Component A, and temporarily terminating the crosslinkability; and a porous-film-forming composition obtainable in this method. In addition, provided is a method of forming a porous film comprising steps of preparing a porous-film-forming composition by preparing Component A, imparting crosslinkability to Component A and adding a crosslinkability inhibitor to temporarily terminate the crosslinkability; applying the porous-film-forming composition onto a substrate to form a film, drying the film, crosslinking the particles along with removing the crosslinkability inhibitor by heating the dried film.

6 Claims, 1 Drawing Sheet

FIG.1

POROUS-FILM-FORMING COMPOSITION, PREPARATION METHOD OF THE COMPOSITION, POROUS FILM AND SEMICONDUCTOR DEVICE

RELATED APPLICATION

This application claims priority from Japanese Patent Application No. 2004-017994, filed Jan. 27, 2004, the disclosure of which is incorporated by reference herein in its entirety.

BACKGROUND OF THE INVENTION

1. Field of the Invention

The present invention relates to a film-forming composition capable of forming a film having excellent dielectric properties, adhesion, film uniformity and mechanical strength, and having reduced moisture absorption; a preparation method of a porous film; a porous film formed thereby; and a semiconductor device which comprises the porous film inside.

2. Description of the Related Art

In the fabrication of a semiconductor integrated circuit, as the circuit is highly integrated, an increase in interconnect delay time due to an increase in interconnect capacitance, which is a parasitic capacitance between metal interconnections, disturbs the performance enhancement of the semiconductor circuit. The interconnect delay time is so-called RC delay which is in proportion to the product of the electric resistance of the metal interconnection and the electric capacitance between the interconnections. In order to minimize this interconnect delay time, the resistance of a metal interconnection or the interconnect capacitance has to be decreased.

By reducing the resistance of the interconnection metal and the interconnect capacitance, an interconnect delay can be lowered even in a highly integrated semiconductor device. This enables size reduction and speeding up of a semiconductor device. Moreover, power consumption can be minimized.

In recent years, metallic copper interconnections have been more popularly used in the structure of a semiconductor device than the conventional aluminum interconnections in order to reduce the resistance of metal interconnections. However, performance enhancement cannot be attained desirably only by the adoption of such a structure. A reduction in interconnect capacitance is an urgent necessity for obtaining a semiconductor device having a higher performance.

One method for minimizing interconnect capacitance is to reduce the dielectric constant (relative permittivity) of an interlayer insulating film disposed between metal interconnections. In order to reduce the dielectric constant of a material to about 2.5 or less, there is a method of introducing pores inside thereof to make it porous.

However, the material which has been made porous inevitably has lowered mechanical strength. This becomes a serious problem in the fabrication of a semiconductor device. In addition, lowering in the mechanical strength of a film leads to inadequate strength of the semiconductor device itself, causing a problem such as deterioration in the reliability of the semiconductor device.

Development of a material having both a low dielectric constant and high mechanical strength has come to be indispensable.

Methods for forming an interlayer insulating film known to date can be classified roughly into a chemical vapor deposition method and an application method. Each of these methods has its own merits and demerits. From the viewpoint of the mechanical strength, however, the chemical vapor deposition method is advantageous when a dielectric constant is about 2.6 or greater, while the application method is advantageous when a dielectric constant is about 2.6 or less.

Among various materials used in the application method, materials having a main skeleton of silicon oxide in which pores can be formed relatively easily compared with organic materials are expected as a next-generation insulating material.

When a conventional material is used in the application method, however, it is difficult to simultaneously satisfy a low dielectric constant and high mechanical strength necessary for the practical manufacture of a semiconductor device.

In the first example, it is described in Japanese Patent Application Unexamined Publication No. 9-315812/1997 that although a product obtained by hydrolytic condensation of an ordinarily employed silicon-based monomer cannot have an adequate strength, it is possible to form a film having a low dielectric constant which is excellent in adhesion with a coated surface, mechanical strength, chemical resistance and crack resistance by using a composition containing the reaction product between silica particles and hydrolytic condensation products of a mixture of alkoxysilane represented by $X_nSi(OR)_{4-n}$, and halogenated silane represented by $X_nSiX'_{4-n}$.

In the second example, according to the methods described in Japanese Patent Application Unexamined Publication Nos. 2001-294809, 2001-354904 and 2002-20688, a product obtained by the hydrolytic condensation of a silane compound in the presence of a basic compound is used in order to overcome the above problems. It is also described that a material prepared by these methods is made of a macromolecule and is not in the form of particles.

In the third example, according to Japanese Patent Application Unexamined Publication No. 9-315812/1997, disclosed is a film-forming coating solution, comprising silica particles in order to improve the mechanical strength of the film. In this method, a silica-based coating solution is obtained by the reaction between silica particles and a partial hydrolysate of alkoxysilane or halogenated silane on the silica surface.

SUMMARY OF THE INVENTION

However, each example has its own problem.

In the first example, the film prepared in such a manner inevitably contains a halide ion derived from the halogenated silane used as the raw material and causes fatal problems such as decrease in yield and deterioration in performance in the fabrication of a semiconductor device.

In the second example, the material obtained by these methods has insufficient strength and therefore cannot be applied to the manufacture of a semiconductor device in practice.

In the third example, improvement of mechanical strength is hardly expected in this method because a silanol group having highest reactivity and being effective for the improvement of mechanical strength is not provided for the crosslinking reaction upon formation of the coating solution but consumed for the surface modification reaction of silica.

With the foregoing in view, an object of the present invention is to provide a porous-film-forming coating solution capable of easily forming a film having a freely controlled thickness in the process ordinarily employed for semiconductor fabrication, and having excellent mechanical strength and dielectric properties. Another object of the invention is to provide a high-performance and high-reliability semiconductor device having, inside thereof, the porous film.

The present inventors have carried out an extensive investigation with a view to developing the porous-film-forming coating solution as described above. As a result, it was found that a coating solution comprising a porous-film-forming composition prepared in a method comprising steps of forming particles, imparting crosslinkability to the particles, and temporarily terminating the crosslinkability can form a film exhibiting excellent mechanical strength and dielectric properties.

The method for preparing a porous-film-forming composition according to the invention comprises a step of preparing polysiloxane, silica or zeolite particles (which will hereinafter be called "Component A"), a step of imparting crosslinkability to Component A and a step of temporarily terminating the crosslinkability.

The step of imparting crosslinkability to Component A may preferably comprise addition of an organosilicon compound (which will hereinafter be called "Component B").

The step of temporarily terminating the crosslinkability may preferably comprise addition of carboxylic acid having, in the molecule thereof, at least two carboxyl groups.

The carboxylic acid may be preferably selected from the group consisting of oxalic acid, malonic acid, malonic anhydride, maleic acid, maleic anhydride, fumaric acid, glutaric acid, glutaric anhydride, citraconic acid, citraconic anhydride, itaconic acid, itaconic anhydride and adipic acid.

The porous-film-forming composition of the invention may be preferably obtainable in the method for preparing the porous-film-forming composition.

The method for forming a porous film according to the invention comprises a step of preparing a porous-film-forming composition by preparing Component A, imparting crosslinkability to Component A, and adding a crosslinkability inhibitor to temporarily terminate the crosslinkability; a step of applying the porous-film-forming composition to a substrate to form a film; a step of drying the film; and a step of crosslinking Component A along with removing the crosslinkability inhibitor by heating the dried film.

The step of imparting crosslinkability to Component A may preferably comprise addition of Component B.

The step of temporarily terminating the crosslinkability may preferably comprise addition of carboxylic acid having, in the molecule thereof, at least two carboxyl groups.

The carboxylic acid may be preferably selected from the group consisting of oxalic acid, malonic acid, malonic anhydride, maleic acid, maleic anhydride, fumaric acid, glutaric acid, glutaric anhydride, citraconic acid, citraconic anhydride, itaconic acid, itaconic anhydride and adipic acid.

The porous film of the invention may be preferably obtainable in the above method for forming a porous film.

The semiconductor device according to the invention has inside thereof a porous film formed using a porous-film-forming composition obtainable in a method comprising a step of preparing Component A, a step of imparting crosslinkability to Component A and a step of temporarily terminating the crosslinkability.

The step of imparting crosslinkability to Component A may preferably comprise addition of Component B.

The step of temporarily terminating the crosslinkability may preferably comprise addition of carboxylic acid having, in the molecule thereof, at least two carboxyl groups.

The carboxylic acid may be preferably selected from the group consisting of oxalic acid, malonic acid, malonic anhydride, maleic acid, maleic anhydride, fumaric acid, glutaric acid, glutaric anhydride, citraconic acid, citraconic anhydride, itaconic acid, itaconic anhydride and adipic acid.

The porous film may preferably exist, in the semiconductor device, as an insulating film between metal interconnections in the same layer of multi-level interconnections or between upper and lower metal interconnection layers.

In the method for preparing a porous-film-forming composition according to the invention, a porous-film-forming composition capable of forming a porous film excellent in dielectric properties, adhesion, uniform application and mechanical strength can be formed.

The porous-film-forming composition of the invention can form a porous film excellent in dielectric properties, adhesion, uniform application and mechanical strength.

In the method for preparing a porous film according to the invention, a porous film excellent in dielectric properties, adhesion, uniform application and mechanical strength can be formed.

The porous film of the invention can provide an insulating film excellent in dielectric properties, adhesion, uniform application and mechanical strength.

According to the invention, it is possible to fabricate a semiconductor device equipped with high-performance multilayer interconnections having an insulating film excellent in dielectric properties, adhesion, film uniformity and mechanical strength.

Various aspects of the present invention will now be described in more detail with respect to other embodiments described herein. It should be appreciated that the invention can be embodied in different forms and should not be construed as limited to the embodiments set forth herein. Rather, these embodiments are provided so that this disclosure will be thorough and complete, and will fully convey the scope of the invention to those skilled in the art.

In the drawings, the thickness of lines, layers and regions may be exaggerated for clarity. It will be understood that when an element is referred to as being "on" another element, it can be directly on the other element or intervening elements may also be present.

The terminology used in the description of the invention herein is for the purpose of describing particular embodiments only and is not intended to be limiting of the invention. As used in the description of the invention and the appended claims, the singular forms "a", "an" and "the" are intended to include the plural forms as well, unless the context clearly indicates otherwise.

Unless otherwise defined, all technical and scientific terms used herein have the same meaning as commonly understood by one of ordinary skill in the art to which this invention belongs.

DETAILED DESCRIPTION OF THE PREFERRED EMBODIMENTS

Each step will hereinafter be described.

The polysiloxane, silica or zeolite particles are represented by the following formula (1):

$$(R^1)_{(4-2n)}SiO_n \tag{1}$$

Herein, $R^1$ represents a hydrogen atom or a straight chain, branched or cyclic $C_{1-8}$ alkyl group or an aryl group which both groups may have a substituent, with the proviso that when a plurality of $R^1$s are contained, the $R^1$s may be independently the same or different.

The n stands for a number of from 1.5 to 2. In general, when n is not equal to 2, they are called polysiloxane. When the n is equal to 2, they are called silica. Among them, one having a zeolite structure or a precursor thereof with a regular structure is called zeolite.

The first step of preparing particles is not particularly limited, but can be divided into the method for preparing polysiloxane or silica particles having no regular repeating structure and the method for preparing zeolite particles having a regular repeating structure.

First, an example of the preparation method of polysiloxane or silica particles will be given. A number of methods are known starting from the report of J. Collid Interface Sci., 26, 62-69(2968). It is generally known that spherical polysiloxane or silica particles can be formed by subjecting alkoxysilane to hydrolytic condensation in water or a water-containing organic solvent in the presence of a basic catalyst.

Such particles can be prepared using, as a raw material, one or more silanes represented by the following formula (2):

$$(R^1)_{(4-m)}Si(OR^2)_m \qquad (2)$$

wherein $R^1$ has the same meaning as described in formula (1); $R^2$ represents a straight chain or branched $C_{1-4}$ alkyl group which may have a substituent, with the proviso that when a plurality of $R^2$s are contained, the $R^2$s may be independently the same or different; and m stands for an integer of from 2 to 4; or the following formula (3):

$$(R^1)_{(3-i)}(OR^2)_iSiR^3Si(R^1)_{(3-j)}(OR^2)_j \qquad (3)$$

wherein $R^1$ and $R^2$ have the same meanings as described in formula (2); $R^3$ represents a straight chain or branched $C_{1-10}$ alkylene, alkenylene, alkynylene or arylene group which may have a substituent, with the proviso that a plurality of $R^1$s or $R^2$s are contained, the $R^1$s or $R^2$S may be independently the same or different; and i and j each independently represents 2 or 3.

Examples of the silane represented by formula (2) or (3) may include trimethoxysilane, triethoxysilane, tripropoxysilane, tributoxysilane, tetramethoxysilane, tetraethoxysilane, tetrapropoxysilane, tetrabutoxysilane, methyltrimethoxysilane, methyltriethoxysilane, methyltripropoxysilane, ethyltrimethoxysilane, ethyltriethoxysilane, propyltrimethoxysilane, propyltriethoxysilane, butyltrimethoxysilane, butyltriethoxysilane, dimethyldimethoxysilane, dimethyldiethoxysilane, 3-glycidoxypropyltrimethoxysilane, 3-glycidoxypropyltriethoxysilane, 3-methacryloxypropyltrimethoxysilane, 3-metharyloxypropyltriethoxysilane, 3-acryloxypropyltrimethoxysilane, 3-acryloxypropyltriethoxysilane, 2-(3,4-epoxycyclohexylethyl)trimethoxysilane, 2-(3,4-epoxycyclohexylethyl)triethoxysilane, 3-mercaptopropyltrimethoxysilane, 3-mercaptopropyltriethoxysilane, bis-1,2-(trimethoxysilyl)ethane, bis-1,6-(trimethoxysilyl)hexane and bis-1,4-(trimethoxysilyl)benzene. They may preferably include, of these compounds, tetramethoxysilane, tetraethoxysilane, tetrapropoxysilane, tetrabutoxysilane, methyltrimethoxysilane, methyltriethoxysilane and methyltripropoxysilane. They may more preferably include tetramethoxysilane, tetraethoxysilane, methyltrimethoxysilane and methyltriethoxysilane.

Examples of the basic catalyst used for hydrolytic condensation may include amines such as ammonia, methylamine, dimethylamine, trimethylamine, ethylamine, diethylamine, triethylamine, propylamine, dipropylamine, tripropylamine, diisobutylamine, butylamine, dibutylamine, tributylamine, triethanolamine, pyrrolidine, piperidine, morpholine, piperazine, pyridine, pyridazine, pyrimidine, pyrazine and triazine; quaternary ammonium hydroxides such as tetramethylammonium hydroxide, tetraethylammonium hydroxide, tetrapropylammonium hydroxide, tetrabutylammonium hydroxide and choline; and alkali metal hydroxides or alkaline earth metal hydroxides such as sodium hydroxide, potassium hydroxide and calcium hydroxide.

The basic catalyst may be added preferably in an amount of from 0.001 to 10 mols, preferably from 0.01 to 1.0 mol per mol of the silane compound. Water used for hydrolysis may be added preferably in an amount of from 0.5 to 100 times, more preferably from 1 to 10 times as much as the mol amount necessary for completely hydrolyzing the silane compound.

When particles are prepared by hydrolysis of a silane compound, a solvent such as an alcohol corresponding to the alkoxy group of the silane compound can be added in addition to water. Examples may include methanol, ethanol, isopropyl alcohol, butanol, propylene glycol monomethyl ether and propylene glycol monopropyl ether. Other examples may include acetone, methyl ethyl ketone, tetrahydrofuran, acetonitrile, formamide, dimethylformamide, dimethylacetamide, and dimethylsulfoxide. The solvent other than water may be preferably added in an amount of from 1 to 1000 times by weight, more preferably from 2 to 100 times by weight, based on the weight of the silane compound.

The hydrolytic condensation time of the silane compound may be preferably from 0.01 to 100 hours, more preferably from 0.1 to 50 hours. Hydrolytic condensation temperature may be preferably from 0 to 100° C., more preferably from 10 to 80° C.

The preparation method of zeolite particles will next be explained. Zeolite particles can be prepared by the hydrolytic condensation of alkoxysilane in combination with a specific basic substance, especially a quaternary ammonium hydroxide. The actual example of such a reaction is described in J. Am. Chem. Soc. 122, 3530-3531(2000). For example, a particle suspension of zeolite crystals can be prepared by adding tetrapropylammonium hydroxide (20 to 25 wt %) to tetraethyl orthosilicate, maturing the resulting mixture at 30° C. for 3 days, and further maturing at 80° C. for 25 hours.

Such zeolite particles can be prepared using, as a raw material, at least one silane represented by the following formula (4):

$$Si(OR^2)_4 \qquad (4)$$

wherein $R^2$ has the same meaning as described in formula (2). Examples of the silane may include tetramethoxysilane, tetraethoxysilane, tetrapropoxysilane and tetrabutoxysilane.

Examples of the catalyst for hydrolysis may include a quaternary ammonium hydroxide represented by the following formula (5):

$$(R^4)_4N^+OH^- \qquad (5)$$

wherein $R^4$s may be the same or different and each independently represents a hydrogen atom or a straight chain, branched or cyclic $C_{1-20}$ alkyl group.

Examples of the quaternary ammonium hydroxide represented by formula (5) may preferably include tetramethylammonium hydroxide, tetraethylammonium hydroxide, tetrapropylammonium hydroxide, tetrabutylammonium hydroxide, and choline. They may more preferably include tetrapropylammonium hydroxide.

The quaternary ammonium hydroxide catalyst may be preferably added in an amount of from 0.001 to 50 mols, more preferably from 0.01 to 5.0 mols, per mol of the silane compound. Water for hydrolysis may be used preferably in an amount of from 0.5 to 100 times by mol, more preferably from 1 to 10 times by mole, based on the mol amount necessary for completely hydrolyzing the silane compound.

When zeolite particles are prepared by the hydrolysis of a silane compound, a solvent such as an alcohol corresponding to the alkoxy group of the silane compound can be added in addition to water. Examples of the solvent may include methanol, ethanol, isopropyl alcohol and butanol. The solvent other than water may be preferably added in an amount of from 0.1 to 10 times by weight, more preferably from 0.5 to 2 times by weight, based on the weight of the silane compound.

The hydrolysis time of the silane compound represented by formula (4) may be preferably from 1 to 100 hours, more preferably from 10 to 70 hours, while the temperature may be preferably from 0 to 50° C., more preferably from 15 to 30° C. Temperature for the heat treatment following the hydrolysis may be preferably 30° C. or greater, more preferably 50° C. or greater. When the temperature exceeds the boiling point of the solvent used for the hydrolysis under atmospheric pressure, the silane compound may be treated in a hermetically sealed container. Heating time may be preferably from 1 to 100 hours, more preferably from 10 to 70 hours.

Component A thus obtained may be dispersed in a reaction solvent such as water or alcohol. If the solvent is distilled off to obtain dry particles, the particles may inevitably have an increased particle size owing to the secondary aggregation, which may impair flatness of the surface of the resulting porous film. It may be therefore preferred to adjust the concentration while leaving the particles under wet condition.

Component A may preferably have a zeolite structure. The zeolite structure embraces zeolite crystals having long-range regularity as a crystal lattice and having a particle size of 10 to 15 nm or greater, clusters of 1 nm in particle size having insufficient regularity as a crystal lattice and precursors of zeolite crystals having a particle size of about 10 to 15 nm. The precursor forms a zeolite structure by repeating aggregation and crystal growth. It is possible to form zeolite particles having a variety of particle sizes, but the particle size has to be controlled in order to reduce its influence on the porous film. In the invention, the particle size can be controlled by the kind or concentration of the catalyst or reaction temperature. The average particle size preferably ranging from 1 to 500 nm, more preferably from 1 to 50 nm, still more preferably from 1 to 10 nm may be necessary for attaining the mechanical strength of the target porous film. Within this range, a coating film comparable in smoothness and adhesion to a coating film obtained by a conventionally known macromolecule-containing composition can be obtained. Average particle sizes exceeding 500 nm may not be preferred because many defects may appear in the target porous film.

Particularly in the invention, even if a zeolite precursor having an average particle size of 1 nm or greater but not greater than 10 to 15 nm can form zeolite inside of the coating film during the heat treatment for forming a porous film, and improve the mechanical strength and dielectric properties of the target porous film, similar to particles already having a zeolite structure and an average particle size of 10 to 15 nm or greater. This zeolite structure in the coating film has a crystal structure and forms a uniform microporous structure so that it has excellent mechanical strength even if pores have been distributed in the whole film at a remarkably high percentage. Owing to the porosity of zeolite and a low dielectric constant derived from its original hydrophobicity, a porous film having dielectric properties suited for a semiconductor fabrication process can be obtained.

At least two kinds of zeolite sols having different average particle sizes may be used in combination if necessary. These zeolite sols can be mixed at any ratio, depending on the physical properties of the zeolite sols or the physical properties of the desired porous film.

In the second step, crosslinkability can be given to the particles prepared in the first step. The step of imparting crosslinkability to the particles may preferably include addition of an organosilicon compound as Component B to the particles. The organosilicon compound may be preferably a silicon-containing compound having a low molecular weight and having an active group which can react with Component A. The low molecular weight may be a weight average molecular weight of, preferably 1000 or less, more preferably 800 or less, still more preferably 500 or less. The molecular weight is determined by gel permeation chromatography (GPC) using polystyrene as a standard. Examples of the active group may include silanol and alkoxy groups.

Examples of Component B may include at least one silane compound represented by the following formula (6):

$(R^5)_k Si(OR^6)_{4-k}$ (6)

wherein $R^5$ represents a hydrogen atom or a straight chain, branched or cyclic $C_{1-8}$ alkyl group or an aryl group which both groups may have a substituent; $R^6$s may be the same or different and each independently represents a hydrogen atom or a $C_{1-4}$ alkyl group; and k stands for 0 or 1; and partial hydrolytic condensation product thereof.

Component B can add crosslinkability to Component A by modifying the surface thereof.

In formula (6), $R^5$ preferably represents a hydrogen atom or a straight chain or branched $C_{1-8}$ alkyl group or an aryl group which both groups may have a substituent. Examples may include methyl, ethyl, propyl, isopropyl, butyl, isobutyl, sec-butyl, tert-butyl, pentyl, sec-pentyl, neopentyl, hexyl, 2-ethylhexyl, heptyl, octyl, phenyl, o-tolyl, m-tolyl, p-tolyl, xylyl and benzyl groups.

In formula (6), $R^6$ represents a hydrogen atom or a $C_{1-4}$ alkyl group. Specific examples may include methyl, ethyl, propyl, isopropyl and butyl groups. In formula (6), k stands for 0 or 1.

Examples of the silane compound represented by formula (6) include, but not limited to, trimethoxysilane, triethoxysilane, tetramethoxysilane, tetraethoxysilane, tetrapropoxysilane, tetrabutoxysilane, methyltrimethoxysilane, methyltriethoxysilane, methyltripropoxysilane, ethyltrimethoxysilane, propyltrimethoxysilane, butyltrimethoxysilane, pentyltrimethoxysilane, hexyltrimethoxysilane, 2-ethylhexyltrimethoxysilane, phenyltrimethoxysilane, trimethylmethoxysilane and triethylmethoxysilane.

The most important step in the invention is the third step of temporarily freezing the crosslinking reaction. Since this step is found, a silanol group having the highest reactivity can be kept stable until the film formation, which leads to the formation of a film having remarkably high strength and low dielectric constant.

In Japanese Patent Application Unexamined Publication No. 9-315812/1997, a film having a low dielectric constant and high mechanical strength is prepared by mixing a hydrolysate of a silane compound and silica particles. This known method, however, does not have the third step which has been found newly in the invention. The consideration is limited to the reaction between the hydrolysis condensation product of a silane compound and silica particles. It is nothing more than mixing these two substances for surface modification. Strength and reactivity of the bonding between the surface-modified particles were not studied sufficiently so that the known method lacks a manner of making use of the bonding between particles as a more active bonding group or a manner of temporarily terminating the active bonding group. In the invention, a porous film having excellent mechanical strength can be actualized by causing crosslinkable active fine particles having an active crosslinkable group to be present during the formation of the porous film.

As a mode for carrying out the third step, which is a characteristic of the invention, the crosslinking reactivity on the surface of Component A to which crosslinkability has been imparted-can be temporarily terminated by the addition of a crosslinkability-inhibiting substance just after the second step in which a crosslinkability-imparting substance such as a silane compound has been added to a solution containing Component A. In the subsequent heating step for forming the porous film, the crosslinkability-inhibiting substance disappears and crosslinking reactivity appears, whereby the thin porous film having excellent mechanical strength and thus having advantages of the invention can be obtained.

It is conventionally known that in the field of the preparation of a hard coating film not containing fine particles, a composition for forming the hard coating film has acquired storage stability by keeping its acidic pH by using an acidic substance. Also in the field of the preparation of a low-dielectric-constant film not containing porous particles, the film is presented with storage stability by maintaining its acidic pH in a similar manner to that employed for the preparation of the hard coating film as described in Japanese Patent Application Unexamined Publication Nos. 2001-316624 and 2001-354903.

However, the third step of the invention does not attain stabilizing action by maintaining an acidic pH, but is characterized in that the crosslinkage between particles is inhibited by a substance having a specific structure. In other words, the effect of the invention for freezing crosslinking reactivity cannot be attained even by the adjustment to equal pH by a substance having a structure other than those specified in the invention.

In the invention, carboxylic acid having, in the molecule thereof, at least two carboxyl groups can be used as the inhibitor for freezing the crosslinkability of the porous particles having crosslinking reactivity. Particularly preferable examples of a carboxylic acid having, in the molecule thereof, two carboxyl groups, may include oxalic acid, malonic acid, malonic anhydride, maleic acid, maleic anhydride, fumaric acid, glutaric acid, glutaric anhydride, citraconic acid, citraconic anhydride, itaconic acid, itaconic anhydride and adipic acid. The specific structures thereof are profoundly effective for the termination of a crosslinking reaction between fine particles. Such a inhibitor may be added preferably in an amount of from 0.005 to 0.5 mol, per mole of the alkoxy and/or silanol group of Component B. It should be noted that the timing of its addition is the most important factor. The inhibitor is added when the crosslinking reactivity of Component B reaches its peak. Then, the crosslinkability of the porous particles can be frozen while being maintained high. More specifically, addition of the above-described compound to the reaction system within one hour, preferably within 30 minutes, after the completion of the second step can bring about satisfactory effects.

The porous-film forming method can comprise applying the porous-film-forming composition to a substrate to form a film, drying the film and heating the dried film.

The inhibitor for terminating (freezing) the crosslinkability can be decomposed in the heating step and as if it has not been added, crosslinking reaction can occur. More specifically, the inhibitor used for inhibiting the crosslinkability is removed by heating and the crosslinkability appears again. By the appearance of the crosslinkability, the particles formed in the first step firmly can be bonded while maintaining pores therebetween. This makes it possible to form a porous film having high mechanical strength.

The method for applying the porous-film-forming composition thus obtained onto a substrate may preferably include spin coating. A film having a desired thickness can be formed by spin coating at an appropriate rotation speed while controlling the solute concentration. The film may include, but not limited to, the film having a thickness of from about 0.2 to 1 μm typically formed in practice. A film with a greater thickness can be formed by the application of the composition twice or more times. Examples of the solvent used for dilution may include aliphatic hydrocarbon solvents such as n-pentane, isopentane, n-hexane, isohexane, n-heptane, 2,2,2-trimethylpentane, n-octane, isooctane, cyclohexane and methylcyclohexane; aromatic hydrocarbon solvents such as benzene, toluene, xylene, ethylbenzene, trimethylbenzene, methylethylbenzene, n-propylbenzene, isopropylbenzene, diethylbenzene, isobutylbenzene, triethylbenzene, diisopropylbenzene and n-amylnaphthalene; ketone solvents such as acetone, methyl ethyl ketone, methyl n-propyl ketone, methyl n-butyl ketone, methyl isobutyl ketone, cyclohexanone, 2-hexanone, methylcyclohexanone, 2,4-pentanedione, acetonylacetone, diacetone alcohol, acetophenone and fenthion; ether solvents such as ethyl ether, isopropyl ether, n-butyl ether, n-hexyl ether, 2-ethylhexyl ether, dioxolane, 4-methyldioxolane, dioxane, dimethyldioxane, ethylene glycol mono-n-butyl ether, ethylene glycol mono-n-hexyl ether, ethylene glycol monophenyl ether, ethylene glycol mono-2-ethylbutyl ether, ethylene glycol dibutyl ether, diethylene glycol monomethyl ether, diethylene glycol dimethyl ether, diethylene glycol monoethyl ether, diethylene glycol diethyl ether, diethylene glycol monopropyl ether, diethylene glycol dipropyl ether, diethylene glycol monobutyl ether, diethylene glycol dibutyl ether, tetrahydrofuran, 2-methyltetrahydrofuran, propylene glycol monomethyl ether, propylene glycol dimethyl ether, propylene glycol monoethyl ether, propylene glycol diethyl ether, propylene glycol monopropyl ether, propylene glycol dipropyl ether, propylene glycol monobutyl ether, dipropylene glycol dimethyl ether, dipropylene glycol diethyl ether, dipropylene glycol dipropyl ether and dipropylene glycol dibutyl ether; ester solvent such as diethylcarbonate, ethyl acetate, γ-butyrolactone, γ-valerolactone, n-propyl acetate, isopropyl acetate, n-butyl acetate, isobutyl acetate, sec-butyl acetate, n-pentyl acetate, 3-methoxybutyl acetate, methylpentyl acetate, 2-ethylbutyl acetate, 2-ethylhexyl acetate, benzyl acetate, cyclohexyl acetate, methylcyclohexyl acetate, n-nonyl acetate, methyl acetoacetate, ethyl acetoacetate, ethylene glycol monomethyl ether acetate, ethylene glycol monoethyl ether acetate, diethylene glycol monomethyl ether acetate, diethylene glycol monoethyl ether acetate, diethylene glycol mono-n-butyl ether acetate, propylene glycol monomethyl ether acetate, propylene glycol monoethyl ether acetate, dipropylene glycol monomethyl ether acetate, dipropylene glycol monoethyl ether acetate, dipropylene glycol mono-n-butyl ether acetate, glycol diacetate, methoxytriglycol acetate, ethyl propionate, n-butyl propionate, isoamyl propionate, diethyl oxalate, di-n-butyl oxalate, methyl lactate, ethyl lactate, n-butyl lactate, n-amyl lactate, diethyl malonate, dimethyl phthalate and diethyl phthalate;

nitrogen-containing solvents such as N-methylformamide, N,N-dimethylformamide, acetamide, N-methylacetamide, N,N-dimethylacetamide, N-methylpropionamide and N-methylpyrrolidone; and sulfur-containing solvents such as dimethyl sulfide, diethyl sulfide, thiophene, tetrahydrothiophene, dimethylsulfoxide, sulfolane and 1,3-propanesultone. These solvents may be used either singly or as a mixture of two or more solvents.

The dilution may differ depending on the viscosity or desired thickness of the film, but typical concentration may be the concentration where 50 to 99 wt %, more preferably 74 to 95 wt % of solvent is contained.

The film thus formed may be then heated preferably to from 50 to 150° C. for several minutes in the drying step (a step usually called "prebaking" in the semiconductor process) to remove the solvent. When zeolite particles are used as Component A, the drying step may be followed by another heating step in order to promote the growth of the zeolite structure in the film using the zeolite particles as nuclei. In this heating step for promoting the growth of the zeolite structure, the film may be heated preferably to from 150 to 400° C., more preferably to from 180 to 250° C. Heating time may be preferably from 1 to 300 minutes, more preferably from 1 to 100 minutes. The film thus obtained has excellent mechanical strength because zeolite having high mechanical strength has been distributed uniformly in the whole film. The film obtained by the above-described method usually has hardness of from 0.7 to 5 GPa and modulus of elasticity of from 5 to 40 GPa, as measured by nanoindentation. This suggests that a film having considerably high mechanical strength is obtained in the invention method as compared with a porous film obtained by adding a heat decomposable polymer to a silicone resin and forming pores by heating the mixture to remove therefrom the polymer. It is because the latter film merely has hardness of from 0.05 to 2 GPa and modulus of elasticity of from about 1.0 to 4.0 GPa.

The porous-film-forming composition of the invention has good storage stability at room temperature and can produce a low-dielectric-constant film without causing an increase in the dielectric constant or lowering in the mechanical strength.

The porous film of the invention may be preferred particularly as an interlayer insulating film for interconnections of a semiconductor integrated circuit. A semiconductor device needs a reduction in the interconnection capacity in order to avoid interconnect delay even after high integration. Various means have been considered for attaining this. One of them is to reduce the dielectric constant of the interlayer insulating film formed between metal interconnections. The interlayer insulating film by using the porous-film-forming composition of the invention makes it possible to downsize and speed up a semiconductor device. Moreover, power consumption can be reduced.

There is a conventional problem that when a porous film is prepared by introduction of the pores so as to lower its dielectric constant, the mechanical strength of the film decreases as the density of the material constituting the film decreases. A decrease in the mechanical strength not only affects the strength of the semiconductor device itself but also causes peeling of the film due to insufficient strength in the step of chemical mechanical polishing ordinarily employed in the semiconductor fabrication process. Particularly, when used as the interlayer insulating film of a semiconductor, the porous film of the invention having high mechanical strength and a low dielectric constant can prevent such peeling, thereby making it possible to fabricate a highly reliable, high-speed and downsized semiconductor device.

Figure 1:
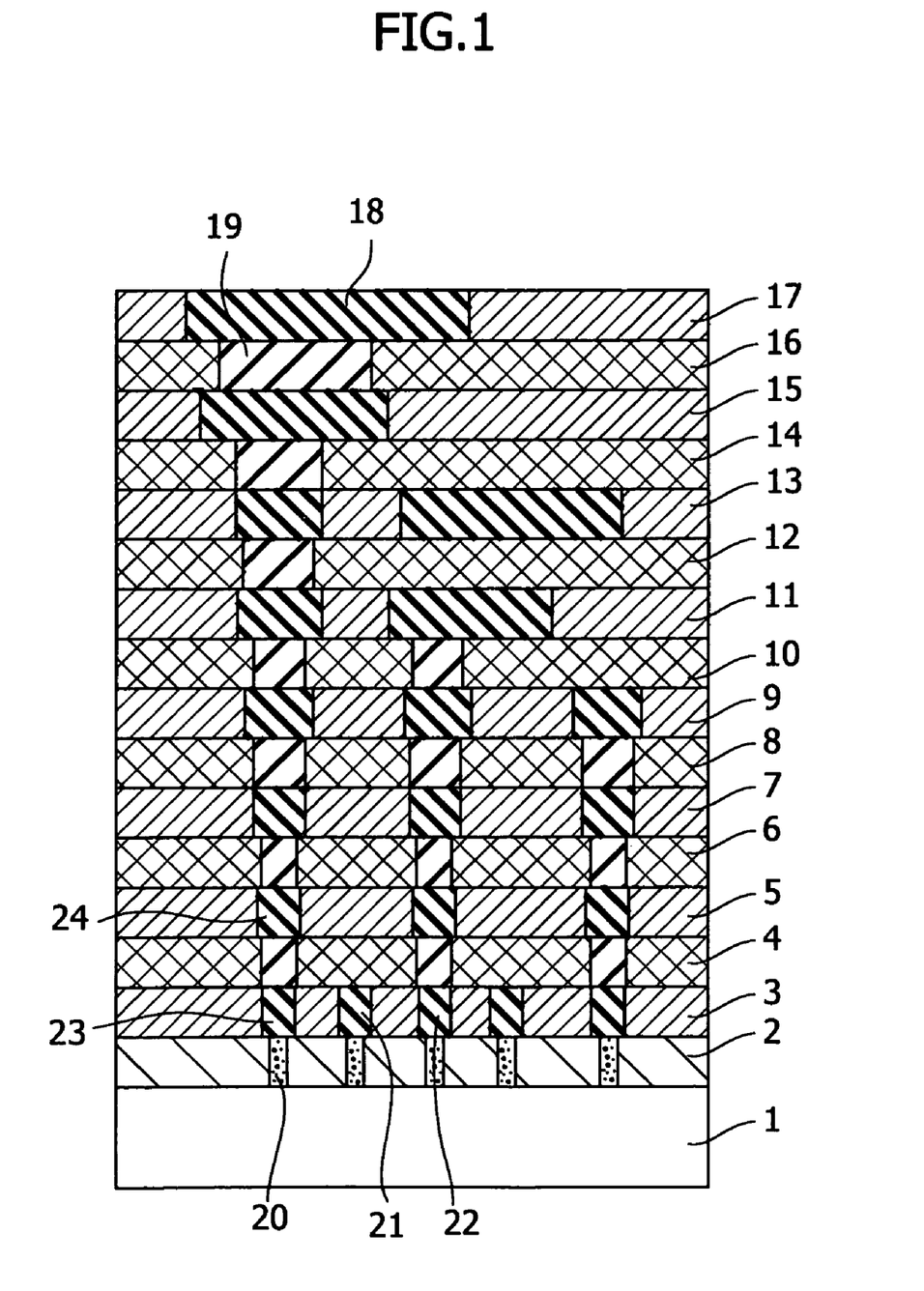
FIG. 1 is a schematic cross-sectional view illustrating one example of the semiconductor device according to the invention.

The embodiment of the semiconductor device of the invention will next be described. FIG. 1 is a schematic cross-sectional view of one example of the semiconductor device of the invention.

In FIG. 1, the substrate 1 is a Si semiconductor substrate such as Si substrate or SOI (Si-on-insulator) substrate, but it may be a compound semiconductor substrate such as SiGe or GaAs. Interlayer insulating films include the interlayer insulating film 2 of the contact layer, interlayer insulating films 3, 5, 7, 9, 11, 13, 15 and 17 of the interconnection layers, and the interlayer insulating films 4, 6, 8, 10, 12, 14 and 16 of the via layers. The interconnection layers corresponding to the lowermost interlayer insulating film 3 through the uppermost interlayer insulating film 17 are abbreviated as M1, M2, M3, M4, M5, M6, M7 and M8, respectively. The via layers corresponding to the lowermost interlayer insulating film 4 through the uppermost interlayer insulating film 16 are abbreviated as V1, V2, V3, V4, V5, V6 and V7, respectively. Although some metal interconnections are numbered with 18 and 21 to 24, the other parts expressed with the same pattern without numbering indicate metal interconnections. The via plug 19 comprises a metal. Copper interconnection usually comprises copper. The parts expressed with the same pattern without numbering as the via plug 19 indicate via plugs. The contact plug 20 is connected to the gate of a transistor (not illustrated) formed on the top surface of the substrate 1 or to the substrate. Thus, the interconnection layers and the via layers are alternately stacked, and multilayer interconnections generally indicate M1 and layers thereabove. In general, M1 to M3 are called local interconnections, M4 and M5 are called intermediate interconnections or semi-global interconnections, and M6 to M8 are called global interconnections.

In the semiconductor device of the present invention, the porous film of the invention can be used as one or more of the inter-level insulating films 3, 5, 7, 9, 11, 13, 15 and 17 of the interconnection layers or the inter-level insulating films 4, 6, 8, 10, 12, 14, and 16 of the via layers.

For example, when the porous film of the invention is used for the interlayer insulating film 3 of the interconnection layer (M1), the interconnection capacitance between the metal interconnection 21 and the metal interconnection 22 can be greatly reduced. When the porous film of the present invention is used for the interlayer insulating film 4 of the via layer (V1), the interconnection capacitance between the metal interconnection 23 and the metal interconnection 24 can be greatly reduced. The use of the low-dielectric-constant porous film of the invention as an interconnection layer can greatly reduce the metal interconnection capacitance in the same layer. On the other hand, the use of the low-dielectric-constant porous film of the invention as a via layer can greatly reduce the interlayer capacitance between the upper and lower metal interconnections. Therefore, the use of the porous film of the invention for all of the interconnection layers and via layers can greatly reduce the parasitic capacitance of the interconnections. The use of the porous film of the invention as insulating films of the interconnections therefore can prevent occurrence of a conventional problem, that is, an increase in the dielectric constant resulting from the moisture absorption of the porous film during the formation of multi-layered interconnections by stacking porous films. As a result, the semiconductor device can perform high-speed and low-power operations.

Since the porous film of the invention has high mechanical strength, the use of it can improve the mechanical strength of a semiconductor device, thereby greatly improving the production yield and the reliability of the semiconductor device.

The present invention will hereinafter be described specifically by Examples. However, the invention should not be construed to be limited to or by them.

EXAMPLE 1

A mixture of 14.6 g of tetraethoxysilane and 25.4 g of a 1 mol/L aqueous solution of tetrapropylammonium hydroxide was stirred at room temperature for 3 days. The reaction mixture was stirred at 75° C. for 12 hours to obtain a colorless zeolite sol. The particle size of the resulting sol was attempted to be measured by a submicron particle-size analyzer (measurement capability of 3 nm) but the whole particle size distribution could not be obtained because the bottom edge of the particle size distribution was 5 nm.

After 8 g of a 25 wt % aqueous solution of tetramethylammonium hydroxide, 512 g of ultrapure water, 960 g of ethanol and the above-described zeolite sol were mixed at room temperature, 32 g of tetraethoxysilane and 24 g of methyltrimethoxysilane were added dropwise at 60° C. for 1 hour. Immediately after completion of the dropwise addition, a 20 wt % aqueous solution of maleic acid was added. To the resulting solution was added 320 g of propylene glycol monopropyl ether. Then, the resulting solution was concentrated until the weight of the solution became 320 g. Ethyl acetate was then added and the resulting mixture was washed twice with ultrapure water. The ethyl acetate phase was separated and ethyl acetate was then distilled off under reduced pressure, whereby the target composition was obtained.

EXAMPLE 2

A mixture of 6.3 g of 28 wt % aqueous ammonia, 34 g of ultrapure water and 640.4 g of methanol was stirred at 10° C. Tetramethoxysilane (85.2 g) was added dropwise to the resulting solution over 1.5 hours. The particle size of the resulting methanol-dispersed silica sol was attempted to be measured by a submicron particle-size analyzer (measurement capability: 3 nm) but the whole particle size distribution could not be measured because the bottom edge of the particle size distribution was 5 nm.

After 8 g of a 25 wt % aqueous solution of tetramethylammonium hydroxide, 512 g of ultrapure water, 960 g of ethanol and 1 g of the above-described methanol sol were mixed at room temperature, 32 g of tetraethoxysilane and 24 g of methyltrimethoxysilane were added dropwise at 55° C. over 1 hour. Immediately after completion of the dropwise addition, a 20 wt % aqueous solution of maleic acid was added. To the resulting solution was added 320 g of propylene glycol monopropyl ether. The resulting solution was concentrated until the weight of the solution became 320 g. Ethyl acetate was then added and the resulting mixture was washed twice with ultrapure water. The ethyl acetate phase was separated and ethyl acetate was then distilled off under reduced pressure, whereby the target composition was obtained.

EXAMPLE 3

A mixture of 70 g of ethanol, 35 g of ultrapure water and 3.9 g of 20 wt % tetramethylammonium hydroxide was stirred at 55° C. A mixture of 97 g of tetraethoxysilane, 73 g of methyltrimethoxysilane and 236 g of ethanol, and another mixture of 35 g of a 20 wt % aqueous tetramethylammonium hydroxide solution, 400 g of ethanol and 310 g of ultrapure water were added dropwise simultaneously over 2 hours. The particle size of the resulting polysiloxane particles dispersed in water-ethanol was attempted to be measured by a submicron particle-size analyzer (measurement capability: 3 nm) but the whole particle size distribution could not be measured because the bottom edge of the particle size distribution was 5 nm.

After 8 g of a 25 wt % aqueous solution of tetramethylammonium hydroxide, 512 g of ultrapure-water, 960 g of ethanol and 10 g of the above-described water-ethanol-dispersion silicone resin were mixed at room temperature, 32 g of tetraethoxysilane and 24 g of methyltrimethoxysilane were added dropwise at 55° C. over 1 hour. Immediately after completion of the dropwise addition, a 20 wt % aqueous solution of maleic acid was added. To the resulting solution was added 320 g of propylene glycol monopropyl ether. The resulting solution was concentrated until the weight of the solution became 320 g. Ethyl acetate was then added and the resulting mixture was washed twice with ultrapure water. The ethyl acetate phase was separated and ethyl acetate was then distilled off under reduced pressure, whereby the target composition was obtained.

The method for forming a porous-film-forming composition according to the invention is effective for the preparation of a material for forming a low-dielectric-constant insulating film having high mechanical strength.

The porous-film-forming composition according to the invention is effective as a material for forming a low-dielectric-constant insulating film having high mechanical strength.

The method for forming a porous film according to the invention is effective for preparing a material for forming a low-di-electric-constant insulating film having high mechanical strength.

The porous film according to the invention is effective as a material for forming a low-dielectric-constant insulating film having high mechanical strength.

The semiconductor device according to the invention is effective as a high performance semiconductor device capable of actualizing high-speed low-power-consumption operation.

The invention claimed is:

1. A method for preparing a composition for forming a porous film comprising the steps of:
    a) preparing Component (A), wherein Component (A) is selected from the group consisting of polysiloxane, silica, and zeolite particles;
    b) imparting crosslinkability to Component (A); and
    c) temporarily terminating the crosslinkability of Component (A),
    wherein the step of preparing component (A) takes place in the presence of a basic catalyst or a basic substance,
    the step of imparting crosslinkability to Component (A) comprises addition of Component (B), which comprises at least one organosilicon compound,
    the step of temporarily terminating the crosslinkability of Component (A) comprises addition of a carboxylic acid having at least two carboxyl groups in the molecule thereof,
    and the step of temporarily terminating the crosslinkability of Component (A) takes place within one hour after the step of imparting crosslinkability to component (A).

2. The method for preparing the composition of claim 1, wherein the step of temporarily terminating the crosslinkability of Component (A) comprises addition of a carboxylic acid selected from the group consisting of oxalic acid, malonic acid, malonic anhydride, maleic acid, maleic anhydride, fumaric acid, glutaric acid, glutaric anhydride, citraconic acid, citraconic anhydride, itaconic acid, itaconic anhydride and adipic acid.

3. The method for preparing the composition of claim 1, wherein Component (B) comprises at least one organosilicon compound of formula (6):

$$(R^5)_k Si(OR^6)_{4-k} \quad (6)$$

wherein $R^5$ represents a hydrogen atom or a straight chain, branched, or cyclic $C_{1-8}$ alkyl group or an aryl group which both groups may have a substituent; $R^6$s may be the same or different and each independently represents a hydrogen atom or a $C_{1-4}$ alkyl group; and k is 0 or 1; or partial hydrolytic condensation product thereof.

4. A method for forming a porous film, comprising:
preparing a composition for forming said porous film according to a method comprising the steps of:
a) preparing Component (A), wherein Component (A) is selected from the group consisting of polysiloxane, silica, and zeolite particles;
b) imparting crosslinkability to Component (A); and
c) temporarily terminating the crosslinkability of Component (A);
applying said composition to a substrate to form a film;
drying the film; and
resuming the crosslinkability of Component (A) by heating the dried film,
wherein the step of preparing component (A) takes place in the presence of a basic catalyst or a basic substance,
the step of imparting crosslinkability to Component (A) comprises addition of Component (B), which comprises at least one organosilicon compound,
the step of temporarily terminating the crosslinkability of Component (A) comprises addition of a carboxylic acid having at least two carboxyl groups in the molecule thereof,
and the step of temporarily terminating the crosslinkability of Component (A) takes place within one hour after the step of imparting crosslinkability to component (A).

5. The method for forming a porous film of claim 4, wherein the step of temporarily terminating the crosslinkability of component (A) comprises addition of a carboxylic acid selected from the group consisting of oxalic acid, malonic acid, malonic anhydride, maleic acid, maleic anhydride, flimaric acid, gltitaric acid, glutaric anhydride, citraconic acid, citraconic anhydride, itaconic acid, itaconic anhydride and adipic acid.

6. The method for forming a porous film of claim 4, wherein Component (B) comprises at least one organosilicon compound of formula (6):

$$(R^5)_k Si(OR^6)_{4-k} \quad (6)$$

wherein $R^5$ represents a hydrogen atom or a straight chain, branched, or cyclic $C_{1-8}$ alkyl group or an aryl group which both groups may have a substituent; $R^6$s may be the same or different and each independently represents a hydrogen atom or a $C_{1-4}$ alkyl group; and k is 0 or 1; or partial hydrolytic condensation product thereof.

* * * * *

UNITED STATES PATENT AND TRADEMARK OFFICE
CERTIFICATE OF CORRECTION

PATENT NO. : 7,402,621 B2
APPLICATION NO. : 11/041780
DATED : July 22, 2008
INVENTOR(S) : Ogihara et al.

It is certified that error appears in the above-identified patent and that said Letters Patent is hereby corrected as shown below:

On the Title Page
Item 73, Assignees: Please correct "Matsushita Electric Co., Ltd., Osaka (JP)"
 To read -- Matsushita Electric Industrial Co., Ltd., Osaka (JP) --

In the Claims:
Column 16, Claim 5, Line 15 -16: Please correct "flimaric acid, gltitaric acid,"
 To read -- fumaric acid, glutaric acid, --

Signed and Sealed this

Fourteenth Day of October, 2008

JON W. DUDAS
*Director of the United States Patent and Trademark Office*